United States Patent
Okunishi et al.

(10) Patent No.: US 10,814,532 B2
(45) Date of Patent: Oct. 27, 2020

(54) RESIN-MOLDING DEVICE AND METHOD FOR PRODUCING RESIN-MOLDED PRODUCT

(71) Applicant: TOWA CORPORATION, Kyoto-shi, Kyoto (JP)

(72) Inventors: Yoshito Okunishi, Kyoto (JP); Shinji Takase, Uji (JP); Kazuki Kawakubo, Otsu (JP)

(73) Assignee: TOWA CORPORATION, Kyoto (JP)

( * ) Notice: Subject to any disclaimer, the term of this patent is extended or adjusted under 35 U.S.C. 154(b) by 235 days.

(21) Appl. No.: 15/753,684

(22) PCT Filed: Jul. 8, 2016

(86) PCT No.: PCT/JP2016/070231
§ 371 (c)(1),
(2) Date: Feb. 20, 2018

(87) PCT Pub. No.: WO2017/038254
PCT Pub. Date: Mar. 9, 2017

(65) Prior Publication Data
US 2019/0001536 A1    Jan. 3, 2019

(30) Foreign Application Priority Data
Aug. 28, 2015 (JP) .................................. 2015-168479

(51) Int. Cl.
*B29C 43/36* (2006.01)
*B29C 43/04* (2006.01)
(Continued)

(52) U.S. Cl.
CPC .............. *B29C 43/36* (2013.01); *B29C 43/32* (2013.01); *H01L 21/56* (2013.01); *H01L 21/565* (2013.01);
(Continued)

(58) Field of Classification Search
CPC ......... B29C 43/36; B29C 43/32; B29C 43/52; B29C 43/04; B29C 2043/182; B29C 2033/023; B29C 2043/3205
See application file for complete search history.

(56) References Cited

U.S. PATENT DOCUMENTS

2006/0240140 A1* 10/2006 Banjo ................ B29C 45/1744
425/450.1

FOREIGN PATENT DOCUMENTS

| CN | 2762913 Y | 3/2006 |
|----|-----------|--------|
| CN | 1927572 A | 3/2007 |

(Continued)

OTHER PUBLICATIONS

October 11, 2016 International Search Report issued in International Patent Application No. PCT/JP2016/070231.
(Continued)

*Primary Examiner* — Joseph S Del Sole
*Assistant Examiner* — Mohamed K Ahmed Ali
(74) *Attorney, Agent, or Firm* — Oliff PLC

(57) ABSTRACT

A resin-molding device capable of preventing a resin-molded product from being non-uniform in thickness. A resin-molding device includes: a first and second platen (outside-loaded platen) which are two plate-shaped members arranged parallel to each other to allow a molding die to be arranged in a die arrangement section which is a central region between the platens; a force applier (toggle link and tie bars) for applying a force to the platens from loading points located outside the die arrangement section; a heating mechanism (lower and upper heater plates) provided between the outside-loaded platen and the molding die; and a heat-insulating member (lower and upper heat-insulating members) formed by a plurality of elastic pillar members arranged between the outside-loaded platen and the heating (Continued)

mechanism, the pillar members configured so that the amount of deformation of each pillar member increases from the center of the die arrangement section toward the loading point.

8 Claims, 6 Drawing Sheets

(51) Int. Cl.
    *B29C 43/52*     (2006.01)
    *B29C 43/32*     (2006.01)
    *H01L 21/56*     (2006.01)
    *B29C 33/02*     (2006.01)
    *B29L 31/34*     (2006.01)
    *B29C 43/18*     (2006.01)

(52) U.S. Cl.
    CPC .............. *B29C 43/04* (2013.01); *B29C 43/52* (2013.01); *B29C 2033/023* (2013.01); *B29C 2043/182* (2013.01); *B29C 2043/3205* (2013.01); *B29L 2031/3481* (2013.01); *B29L 2031/3493* (2013.01); *H01L 2224/48091* (2013.01); *H01L 2924/181* (2013.01)

(56) References Cited

FOREIGN PATENT DOCUMENTS

| | | |
|---|---|---|
| CN | 101436558 A | 5/2009 |
| CN | 201501058 U | 6/2010 |
| CN | 104227897 A | 12/2014 |
| JP | H01-297221 A | 11/1989 |
| JP | H10-094864 A | 4/1998 |
| JP | 2004-042356 A | 2/2004 |
| JP | 2007-125783 A | 5/2007 |
| JP | 2011-224911 A | 11/2011 |
| JP | 2014-192362 A | 10/2014 |
| JP | 2015-005611 A | 1/2015 |
| KR | 10-2014-0147698 A | 12/2014 |
| KR | 10-2015-0060493 A | 6/2015 |

OTHER PUBLICATIONS

Mar. 6, 2018 International Preliminary Report on Patentability issued in International Patent Application No. PCT/JP2016/070231.

Apr. 23, 2019 Office Action issued in Chinese Patent Application No. 201680049157.0.

Dec. 19, 2019 Office Action issued in Korean Patent Application No. 10-2018-7007661.

\* cited by examiner

Fig. 4A  PRESENT EMBODIMENT

RESIN-MOLDING DEVICE AND METHOD FOR PRODUCING RESIN-MOLDED PRODUCT

TECHNICAL FIELD

The present invention relates to a resin-molding device for performing a resin-molding process by a compression-molding method, transfer-molding method or the like, as well as a method for producing a resin-molded product.

BACKGROUND ART

It has been common to seal electronic parts with a resin material in order to protect the electronic parts from light, heat, moisture and other environmental factors. For the resin sealing, a resin-molding method is used, such as compression molding or transfer molding. Compression molding is performed as follows, using a molding die formed by an upper die and lower die: A resin material is supplied in a cavity in the lower die. A substrate on which electronic parts are mounted is attached to the upper die. While both the upper and lower dies are heated, the two dies are clamped together, whereby the resin is compressed and a molded product is obtained (e.g. see Patent Literature 1). In the case of the transfer molding, a substrate is attached to a cavity in one of the upper and lower dies. While being heated, the upper and lower dies are clamped together, and a resin is injected into the cavity with a plunger to obtain a molded product (e.g. see Patent Literature 2). In the transfer molding, a portion of the resin is wasted by being left unused in the path through which the resin is supplied from the plunger into the cavity. Accordingly, compression molding has been more popularly used in recent years.

In the resin-molding devices described in Patent Literatures 1 and 2, the upper die is provided on the upper platen via an upper holding portion, while the lower die is provided on the lower platen via a lower holding portion. An amount of pressure is applied from the upper and lower platens via their respective holding portions to the molding die formed by the upper and lower dies. Each of the upper and lower holding portions is provided with a heater plate for heating the upper and lower dies. A heat insulator is provided between each holding portion and the corresponding platen to efficiently heat the upper and lower dies by preventing the heat from the heater plate from escaping to the platen. The heat insulators used in the resin-molding devices described in Patent Literatures 1 and 2 are plate-shaped members. Patent Literature 3 discloses a resin-molding device in which a plurality of heat insulators in the form of upright-placed cylindrical pillars are arranged between the heater plate and the platen. Various materials are used for the heat insulator, such as zirconia, alumina or similar ceramic materials, as well as a glass epoxy laminate formed by molding glass fibers with an epoxy resin.

CITATION LIST

Patent Literature

Patent Literature 1: JP 2011-224911 A
Patent Literature 2: JP 2014-192362 A
Patent Literature 3: JP 01-297221 A
Patent Literature 4: JP 2007-125783 A

SUMMARY OF INVENTION

Technical Problem

In any of the resin-molding devices described in Patent Literatures 1-3, one of the upper and lower platens is the fixed platen, while the other one is the movable platen. The fixed platen is fixed to a pedestal with two or four support columns called the tie bars. The movable platen is arranged between the pedestal and the fixed platen, and is driven by a piston or similar mechanism located between the pedestal and the fixed platen. The piston or similar mechanism for applying the pressing force on the movable platen applies the pressing force on the surface of the movable platen opposite from the surface to which the molding die is attached. Accordingly, the force can be applied within the range of the molding die inside the entire flat area of the movable platen. By comparison, the fixed platen inevitably needs to be fixed outside the area of the molding die, since this platen is fixed to the pedestal by the tie bars which pass by the molding die and penetrate through the movable platen. As a result, two kinds of forces are applied to the fixed platen in the opposite directions, i.e. one force acting on the peripheral side of the flat area (tensile force by the tie bars) and the other force on the central side (pressing force by the molding die), causing the platen to be slightly deflected. The deflected platen has such a shape that its peripheral side is protruded toward the movable platen to a greater extent than its central side. The heat insulator located between the fixed platen and the molding die (upper or lower die) also undergoes deflection along with the fixed platen, since the heat insulator is made of a softer material than the platen. The deflection occurring in the fixed platen and the heat insulator leads to a slight variation in the overall thickness of the resin-sealed product to be created. In recent years, resin-sealed products have been required to meet stricter criteria of the thickness accuracy (e.g. less than ±10 µm). Accordingly, even the slight variation as mentioned earlier must be avoided.

Furthermore, since the heat insulator in most cases is locally fixed to the heater plate by screws or similar means, the heat insulator becomes undulate due to the difference in the coefficient of thermal expansion of the material between the heat insulator and the heater plate. This also causes a variation in the overall thickness of the resin-sealed product to be produced.

Although the description thus far has been concerned with the case of producing a resin-sealed product, the previously described problem generally occurs in the production of resin-molded products regardless of whether or not there is the step of sealing electronic parts.

The problem to be solved by the present invention is to provide a resin-molding device as well as a method for producing a resin-molded product which can prevent a resin-sealed product or other kinds of resin-molded products from being non-uniform in thickness.

Solution to Problem

The resin-molding device according to the present invention developed for solving the previously described problem includes:
a) a first platen and a second platen which are two plate-shaped members arranged parallel to each other in such a manner as to allow a molding die including a pair of mutually facing dies to be arranged in a die arrangement section which is provided between the two platens and is a central region located on a plate surface;

b) a force applier for applying a force from a predetermined loading point to a force-applied platen which is one of the first and second platens;

c) a heating mechanism provided between the force-applied platen and the molding die; and d) a heat-insulating member formed by a plurality of elastic pillar members arranged between the force-applied platen and the heating mechanism, the pillar members configured in such a manner that the amount of deformation of each pillar member increases with the position of the pillar member being closer to the loading point.

In the resin-molding device according to the present invention, since the heat-insulating member is formed by a plurality of elastic pillar members, the amount of deformation of the heat-insulating member can be adjusted at each position. Therefore, as just described, the amount of deformation of the heat-insulating member can be set in such a manner that it increases with the position of the pillar member being closer to the loading point (from an area that is opposite to the loading point, or in other words, an area that is far from the loading point). The phrase that "the amount of deformation of each pillar member increases with the position of the pillar member being closer to the loading point" means that the amount of deformation of the heat-insulating member (i.e. the plurality of pillar members) has the general tendency of increasing toward the loading point across the heat-insulating member. This includes the case where some mutually neighboring pillar members have the same amount of deformation.

In the resin-molding device according to the present invention, the amount of deformation of the heat-insulating member can be set at each position in the heat-insulating member by varying the number density (arrangement density) of the pillar members, cross-sectional area of each pillar member, material (or specifically, level of rigidity) of each pillar member, or a combination of these parameters according to the position.

The "force-applied platen" in the resin-molding device according to the present invention is a platen to which a force is applied from the loading point by the force applier. A distortion of the force-applied platen occurs not only in the case where the loading point is located outside the die arrangement section as in the inventions described in Patent Literatures 1-3, but also in the case where the loading point is located inside (or in a central area of) the die arrangement section, as will be explained later. Therefore, in the resin-molding device according to the present invention, the loading point may be located either outside or inside the die arrangement section. In the following description, the force-applied platen with the loading point located outside the die arrangement section is called the "outside-loaded platen", while the force-applied platen with the loading point located inside the die arrangement section is called the "center-loaded platen". It should be noted that the loading point on the "center-loaded platen" may be located at any position in a central area of the die arrangement section as mentioned earlier and is not limited to the exact center of the section.

The fixed platen mentioned earlier to which a tensile force is applied by the tie bars is an outside-loaded platen. A movable platen to which a force is applied from a loading point located outside the die arrangement section by a piston or other devices is also an outside-loaded platen. In some cases, both the first and second platens become outside-loaded platens, as in the case where the fixed platen and the movable platen mentioned in this paragraph are used in combination. On the other hand, a movable platen to which a force is applied from the loading point inside the die arrangement section (e.g. the central point) by a piston or other devices is a center-loaded platen.

In the case of using an outside-loaded platen in the resin-molding device according to the present invention, the force is applied to the outside-loaded platen from a loading point located outside the die arrangement section, whereby the outside-loaded platen is deflected in such a manner that the portion around the loading point (or closer to the outer circumference) becomes closer to the opposite platen than the central portion. On the other hand, in the heat-insulating member, the pillar members around the loading point are more easily deformed than those at the central portion, since the pillar members are arranged so that the amount of deformation of each pillar member increases with the position being closer to the loading point. Therefore, in the molding die, the deformation of the outside-loaded platen is canceled by that of the heat-insulating member, and the parallelism between the die surfaces of the mutually-facing dies in the molding die is thereby improved. Thus, the resin-molded product to be molded in the molding die is prevented from being non-uniform in thickness.

In the case of using a center-loaded platen in the resin-molding device according to the present invention, the force is applied to the center-loaded platen from a loading point located inside the die arrangement section, whereby the center-loaded platen is deflected in such a manner that the portion around the loading point (or in the central area) becomes closer to the opposite platen than the outer circumferential portion. On the other hand, in the heat-insulating member, the pillar members around the loading point are more easily deformed than those at the central portion, since the pillar members are arranged so that the amount of deformation of each pillar member increases with the position being closer to the loading point. Therefore, in the molding die, the deformation of the center-loaded platen is canceled by that of the heat-insulating member, and the parallelism between the die surfaces of the mutually-facing dies in the molding die is thereby improved. Thus, the resin-molded product to be molded in the molding die is prevented from being non-uniform in thickness.

The heat insulator between the force-applied platen and the heating mechanism is formed by a plurality of separate pillar members. Therefore, the heat insulator is less likely to undulate due to the difference in the coefficient of thermal expansion of the material between the heat insulator and the heating mechanism, unlike the conventional heat insulator consisting of a plate-like integral member.

The pillar members may be made of a metallic material or ceramic material.

Metallic materials are superior to ceramic materials in that they are tougher and less likely to be damaged. However, some metallic materials have high levels of thermal conductivity and accordingly low levels of heat insulation performance. For the present invention, it is preferable to use a highly heat-insulating metallic material having a thermal conductivity of 25 W/(m·□) or lower. Examples of such metallic materials include various kinds of stainless steel as well as Ti-6Al-4V alloy (a titan alloy containing 6% aluminum and 4% vanadium) which is one kind of titan alloy.

Ceramic materials are superior to metallic materials in that they have higher levels of heat insulation performance. Using the pillar members made of a ceramic material yields an even higher energy-saving effect. For example, zirconia or alumina can preferably be used as such a ceramic material.

A preferable form of the pillar members includes a pillar-shaped main body and a heat-insulating film made of a material having a lower thermal conductivity than the main body and provided on one or both of the upper and lower sides of the main body. This allows for the use of a main body having suitable levels of elasticity and strength while achieving a high level of heat insulation performance by the heat-insulating film.

The resin-molding device according to the present invention may be configured in such a manner as to include three or more platens allowing a molding die to be arranged between the neighboring platens, wherein the three or more platens include at least two platens neighboring each other and configured as the first platen and the second platen (as described earlier, one or both of the first and second platens are force-applied platens). This configuration allows a plurality of resin-molded products to be simultaneously created with a single resin-molding device. The number of force-applied platens to be included in the three or more platens may be one or more, regardless of whether the force-applied platens are outside-loaded or center-loaded platens.

The resin-molding device according to the present invention may be configured in such a manner as to include:

a molding module including the first platen, the second platen, the force applier, the heating mechanism and the heat-insulating member, the molding module configured to allow a plurality of the molding modules to be connected to each other in one direction;

a resin-material supplier for supplying a resin material to each molding die in one or a plurality of the molding modules;

a resin-material refilling module including a resin-material refiller for refilling the resin-material supplier with the resin material; and a transfer system for transferring the resin-material supplier, the transfer system extending in the aforementioned direction through the one or plurality of the molding modules and the resin-material refilling module when the one or plurality of the molding modules and the resin-material refilling module are connected in series.

According to such a configuration, while the die-clamping operation is performed in one molding module, the resin-material supplier can be moved to another molding module to supply the molding die in this module with the resin material. Therefore, the production efficiency of the resin-molded products will be improved. Furthermore, since each molding module can be attached to and detached from another molding module, it is possible to use only one or a small number of molding modules when the number of resin-molded products to be manufactured is comparatively small, and appropriately provide additional molding modules when the number of resin-molded products to be manufactured has been increased.

The method for producing a resin-molded product according to the present invention is a method for producing a resin-molded product using the previously described resin-molding device, the method including:

a process of supplying a resin material to a molding die arranged in the die arrangement section;

a process of heating the resin material in the molding die by the heating mechanism; and a process of applying pressure on the molding die by applying a force from the loading point to the force-applied platen by the force applier.

Advantageous Effects of the Invention

With the present invention, it is possible to obtain a resin-molding device as well as a method for producing a resin-molded product which can prevent a resin-sealed product or other kinds of resin-molded products from being non-uniform in thickness.

BRIEF DESCRIPTION OF DRAWINGS

FIGS. 4A and 4B are model diagrams showing the deflection of the platens, heat-insulating members and other elements in the resin-molding device in the first embodiment (FIG. 4A) as well as those in a conventional resin-molding device (FIG. 4B).

DESCRIPTION OF EMBODIMENTS

Embodiments of the resin-molding device and method for producing a resin-molded product according to the present invention are hereinafter described using FIGS. 1A-8.

Figure 1A:
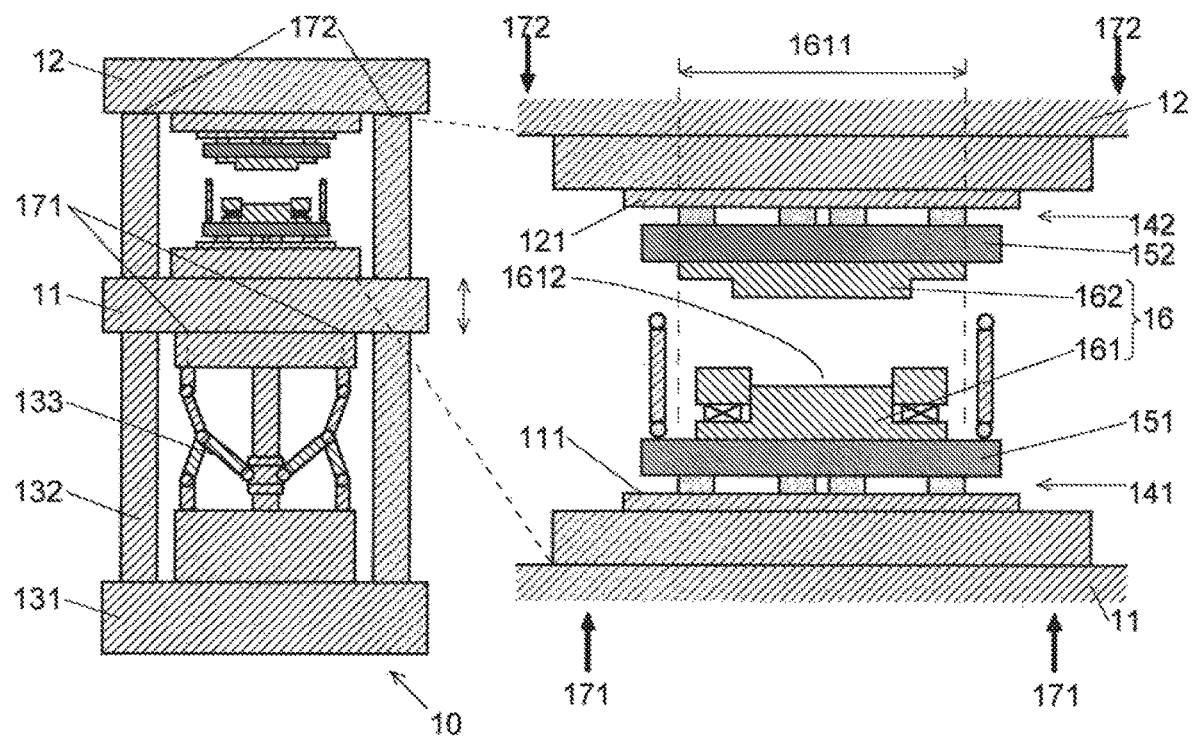
FIG. 1A is a side view (left) and its partially enlarged view (right) of the first embodiment of the resin-molding device according to the present invention.
Figure 1B:
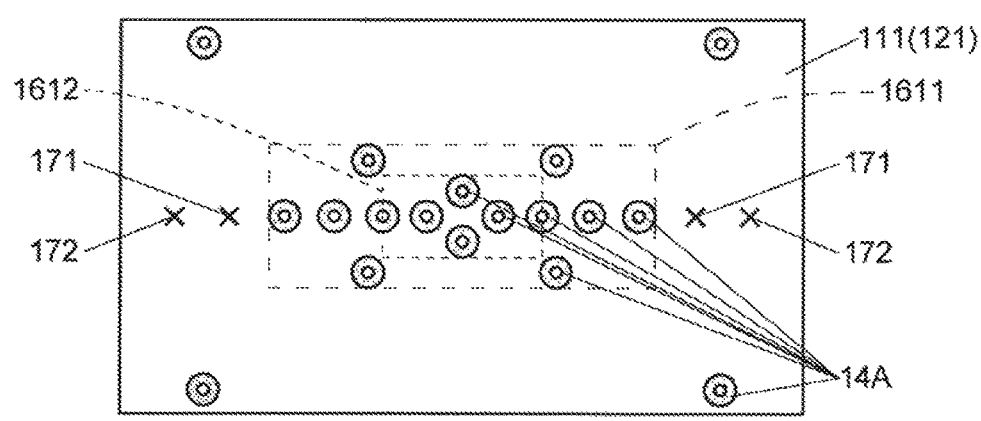
FIG. 1B is a plan view showing an arrangement of pillar members.

(1) First Embodiment (1-1) Configuration of Resin-Molding Device 10 in First Embodiment As shown in FIG. 1A, the resin-molding device 10 in the present embodiment includes two vertical tie bars 132 provided on a pedestal 131 placed on a floor. A toggle link 133 is provided on the pedestal 131. A first platen 11 is provided above the toggle link 133. On the first platen 11, a molding die 16 is arranged at the die arrangement section 1611, which is a central area on the plate surface of the first platen 11, via a lower heat-insulating member 141, lower heater plate 151 and other elements (which will be described later). The toggle link 133 has two toggle mechanisms. The points of action of the two toggle mechanisms are attached to the two loading points 171 which are located on the lower side of the first platen 11 and outside the die arrangement section 1611. The first platen 11 has two holes provided opposite to each other across the die arrangement section 1611 (i.e. outside the die arrangement section 1611), with one tie bar 132 passed through each hole. Accordingly, the tie bars 132 are also located outside the die arrangement section 1611.

A second platen 12 is provided above the first platen 11, with the molding die 16 in between. The upper ends of the two tie bars 132 are fixed to the lower surface of this second platen 12. The positions where the upper ends of the tie bars 132 are fixed become the loading points 172 on the second platen 12. As noted earlier, the tie bars 132 are located outside the die arrangement section 1611 in the first platen 11. Therefore, the loading points 172 are also located outside the die arrangement section 1611.

In the resin-molding device 10 according to the present embodiment, the first and second platens 11 and 12 both correspond to the outside-loaded platens mentioned earlier. The reason will be described later along with an explanation of an operation of the resin-molding device 10. The first platen 11 is movable vertically along the tie bars 132, while the second platen 12 is fixed to the upper end of the tie bars 132. Accordingly, the first platen 11 may be called the "movable platen", while the second platen 12 may be called the "fixed platen".

On the upper side of the first platen 11, a lower heat-insulating member 141 is provided via a spacer plate 111. The lower heat-insulating member 141 is formed by arranging a plurality of pillar members 14A. The individual pillar members 14A are identical in material, shape and size. They are arranged in such a manner that their number density (arrangement density) decreases from the center of the die arrangement section 1611 toward the loading points 171 and 172 (see FIG. 1B). In other words, the pillar members 14A in a central area of the die arrangement section 1611 which is opposite to the loading points 171 and 172 are arranged at a higher number density, while the pillar members 14A on the side where the loading points 171 and 172 are located are arranged at a lower number density. Such a setting of the number density of the pillar members 14A causes the deformation of the entire group of the pillar members 14A in such a manner that the amount of deformation of each pillar member 14A increases from the center of the die arrangement section 1611 toward the loading points 171 and 172.

As for the material of the pillar member 14A, a type of stainless steel (SUS630) is used in the present embodiment. However, any material having sufficient levels of elasticity, heat insulation property and heat resistance at the heating temperature during the use is available. For example, Ti-6Al-4V alloy, zirconia or alumina can be suitably used as the material for the pillar member 14A. The shape of the pillar member 14A is cylindrical in the present embodiment. A rectangular pillar, hexagonal pillar or other forms of pillars different from cylindrical ones may also be used.

On the upper side of the lower heat-insulating member 141, a lower heater plate 151 is provided. This lower heater plater 151 and an upper heater plater 152 (which will be described later) correspond to the heating mechanism in the present invention. The lower plate member 151 is a plate member made of a metal having a higher thermal conductivity than stainless steel or Ti-6Al-4V alloy, with a heater embedded in the plate.

On the lower side of the second platen 12, an upper heat-insulating member 142 is provided via a spacer plate 121, and an upper heater plate 152 is provided on the lower side of the upper heat-insulating member 142. The upper heat-insulating member 142 includes a plurality of pillar members 14A which are similar to those used in the lower heat-insulating member 141. As in the lower heat-insulating member 141, the pillar members 14A are arranged in such a manner that their number density in a central area in the planer direction of the upper platen 12 is higher than in the surrounding area. The upper heater plate 152 has a similar configuration to the lower heater plate 151.

The molding die 16 includes a lower die 161 and an upper die 162. At the center of the lower die 161, a cavity 1612 having a rectangular or circular planar shape is formed. The cavity is a space into which the resin material will be poured. The inner surface of the cavity 1612 can be covered with a release film F (see FIGS. 2A-2F), as will be described later. A substrate S can be attached to the lower surface of the upper die 162 (see FIGS. 2A-2F). The substrate S holds the resin-molded product to be created. In the case of sealing electronic parts with resin, those electronic parts should be mounted on this substrate before the creation of the resin-molded product.

(1-2) Operation of Resin-Molding Device 10 in First Embodiment

An operation of the resin-molding device 10 in the first embodiment is hereinafter described using FIGS. 2A-4B. The following description deals with the case of creating a resin-sealed product in which electronic parts are sealed. Other kinds of resin-molded products can also be created by a similar operation.

Figure 2A:
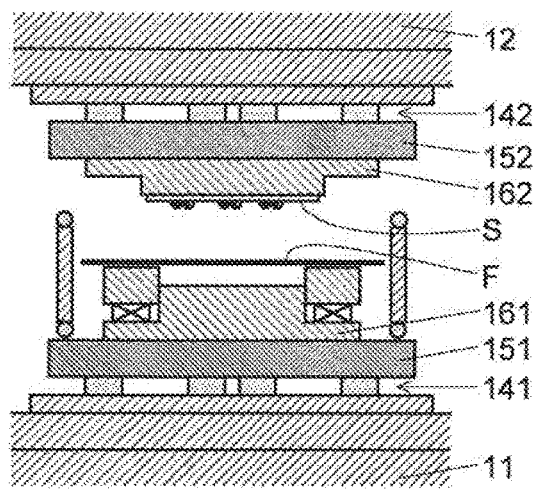
FIGS. 2A-2F are diagrams illustrating an operation of the resin-molding device in the first embodiment.
Figure 2B:
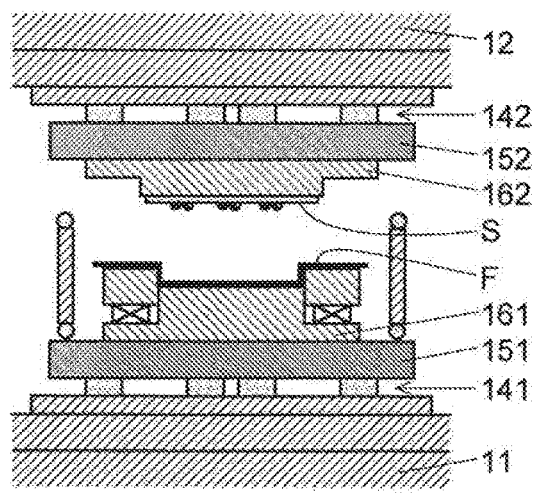

The lower and upper dies 161 and 162 are previously heated to a temperature of 170-180° C. by the lower and upper heater plates 151 and 152, respectively. This state is maintained throughout the processes which will be hereinafter described. In this state, a substrate S on which electronic parts are mounted is attached to the lower surface of the upper die 162, with the parts-mounted surface directed downward (FIG. 2A). Before or after this task is performed, a release film F is spread above the cavity 1612 (FIG. 2A). The air inside the cavity 1612 is drawn by a suction device (not shown) provided on the inner surface of the cavity 1612, whereby the release film F is pulled into the cavity 1612. Additionally, the heat conducted from the lower die 161 softens the release film F, making the film easier to be expanded. In such a state, the inner surface of the cavity 1612 is covered by the release film F (FIG. 2B).

Figure 2C:
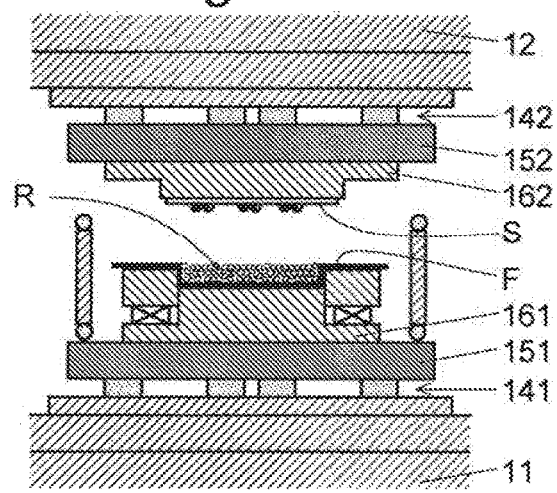

Next, a granular resin material R is supplied into the cavity 1612 (FIG. 2C). For the supply of the resin material R, for example, the device and method for supplying a resin material described in Patent Literature 4 can be used, although the available method is not limited to it.

Figure 2D:
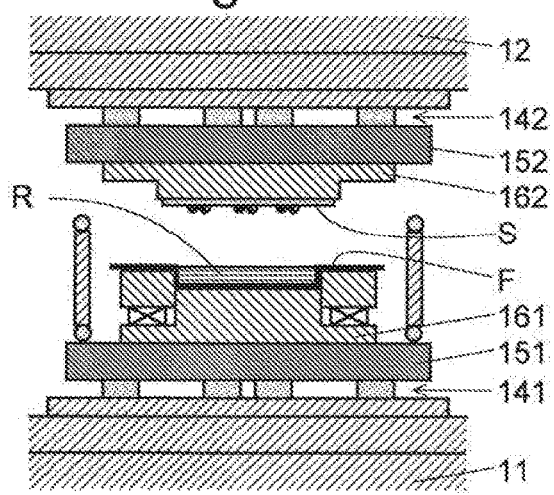

Subsequently, the resin material R is melted by the lower die 161 which has been previously heated by the lower heater plate 151 (FIG. 2D). Simultaneously, the substrate S is heated by the upper die 162 which has been previously heated by the upper heater plate 152. During these heating operations, the lower heat-insulating member 141 provided between the lower heater plate 151 and the first platen 11 as well as the upper heat-insulating member 142 provided between the upper heater plate 152 and the second platen 12 prevent the heat from escaping from the lower heater plate 151 or the upper heater plate 152 into the first platen 11 or the second platen 12.

Figure 2E:
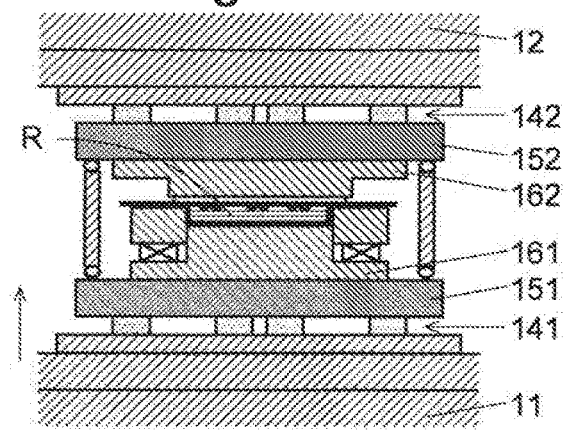
Figure 3:
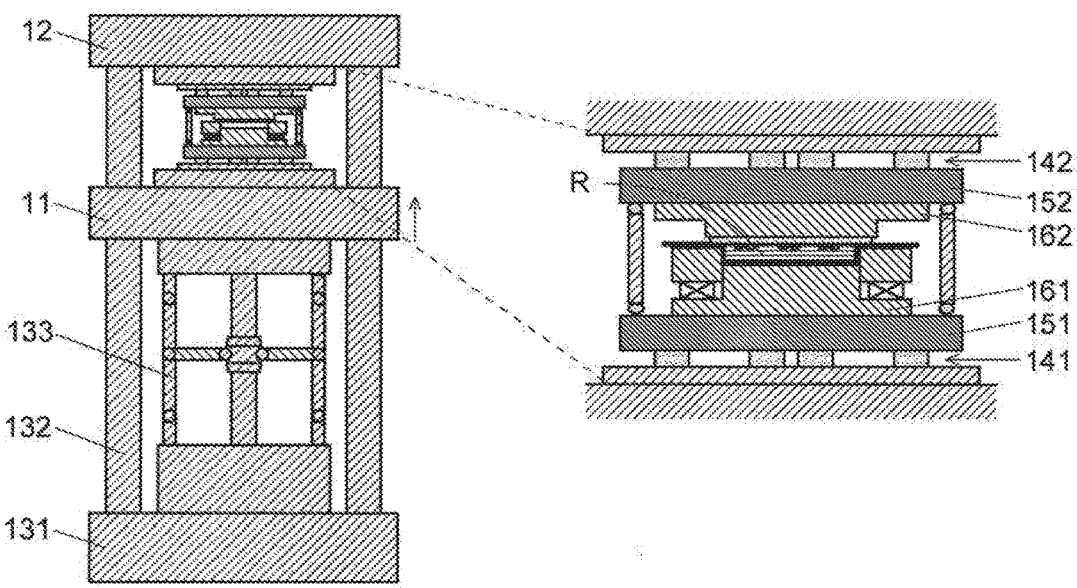
FIG. 3 shows a side view (left) and its partially enlarged view (right) of the resin-molding device in the first embodiment with the dies clamped together.

With the resin material R and substrate S heated in this manner, the first platen 11 is lifted by the toggle link 133 (see FIG. 1A) to a position where the lower surface of the substrate S fixed to the upper die 162 and the electronic parts are immersed in the molten resin material R in the cavity 1612, and the lower and upper dies 161 and 162 are clamped together. By this operation, pressure is applied from the first and second platens 11 and 12 onto the molding die 16, and the resin material R in the cavity 1612 is thereby compressed (FIGS. 2E and 3).

Figure 4B:
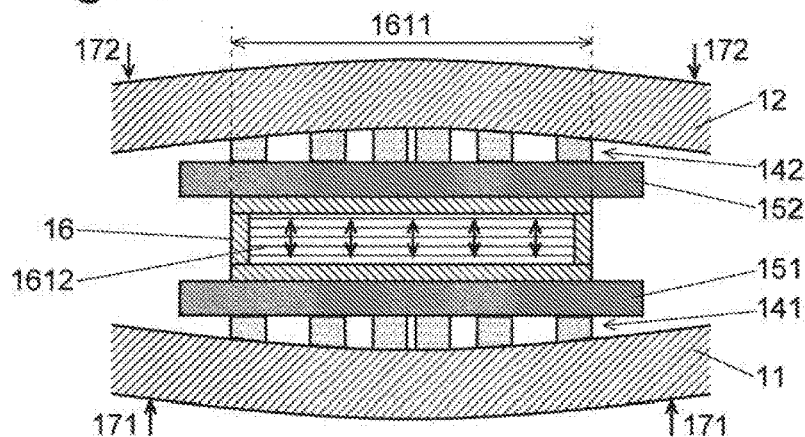
Figure 4B:
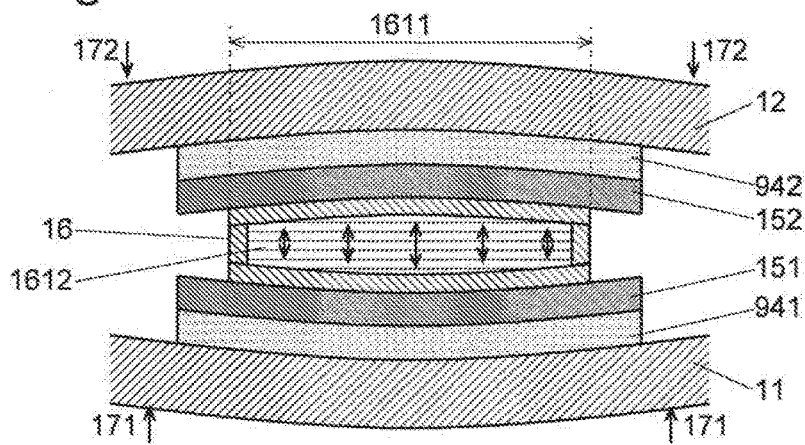

During this compressing operation, the first platen 11 receives an upward force applied from the points of action of the toggle link 133 to the loading points 171 outside the die arrangement section 1611. The second platen 12 receives a downward tensile force applied to the loading points 172 where the tie bars 132 are fixed on the outside of the die arrangement section 1611. The first and second platens 11 and 12 both correspond to the outside-loaded platens, since those platens receive the forces from the loading points 171 and 172 located outside the die arrangement section 1611. Meanwhile, the molding die 16 within the die arrangement section 1611 applies forces to the first and second platens 11 and 12, pushing those platens in the opposite direction to the forces applied to the loading points 171 and 172. Due to these forces, the first and second platens 11 and 12 are deflected in such a manner that they come closer to each other at areas around the loading points than at their central areas, as shown in FIG. 4A. (It should be noted that FIGS. 4A and 4B show the deflection of the first platen 11, second platen 12 and pillar members 14A in a more exaggerated form than in actual cases. The arrangement of the pillar members 14A as well as the shape of the molding die 16 are simplified. The spacer plates and some other elements are omitted.) In the case of a resin-molding device using conventional plate-shaped heat insulators 941 and 942 (FIG. 4B), such deflection of the platens also causes the deflection of the plate-shaped heat insulators 941 and 942. This causes the die surface of the cavity 1612 of the molding die 16 to be pressed by the molten resin material R and deformed in such a manner that the center of the cavity 1612 is bulged outward (the height size at the central area of the cavity 1612 becomes greater than the height size at its peripheral area). Consequently, the resin-molded product to be obtained will be non-uniform in thickness, with its central portion being thicker than the portions closer to the loading points. By comparison, in the case of the resin-molding device 10 according to the present embodiment, since the pillar members 14A are arranged in such a manner that the amount of deformation of each pillar member 14A increases from the center toward the loading points, the pillar members 14A near the loading points where the amount of deformation of the pillar members 14A is large are deflected by a greater amount. In the molding die 16, the deflection of the platens is cancelled by that of the pillar members, and the deformation in the thickness direction of the molding die 16 is thereby suppressed (FIG. 4A). Consequently, the parallelism between the die surface of the upper die 152 (the lower surface in the figure) and that of the lower die 161 (the upper surface of the members constituting the circumference of the cavity 1612 in the figure) is improved. Therefore, the resin-molded product to be obtained by the resin-molding device 10 in the present embodiment is prevented from being non-uniform in thickness.

Figure 2F:
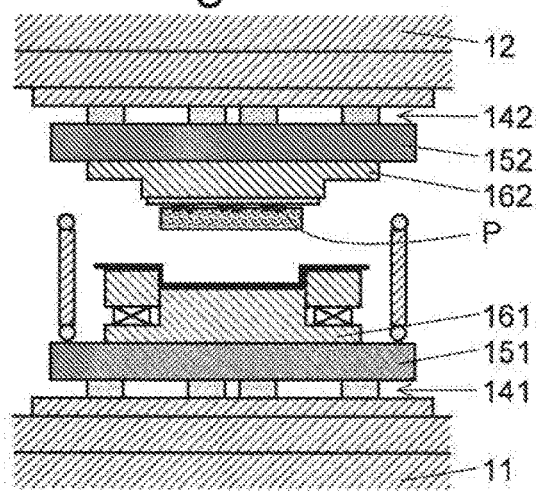

After the resin-molding operation has been performed in the previously described manner and the resin has been cured, the first platen 11 is lowered by the toggle link 133 (see FIG. 1A) to open the lower and upper dies 161 and 162. Then, the resin-molded product with the sealing resin P is released from the cavity 1612 (FIG. 2F).

Figure 5:
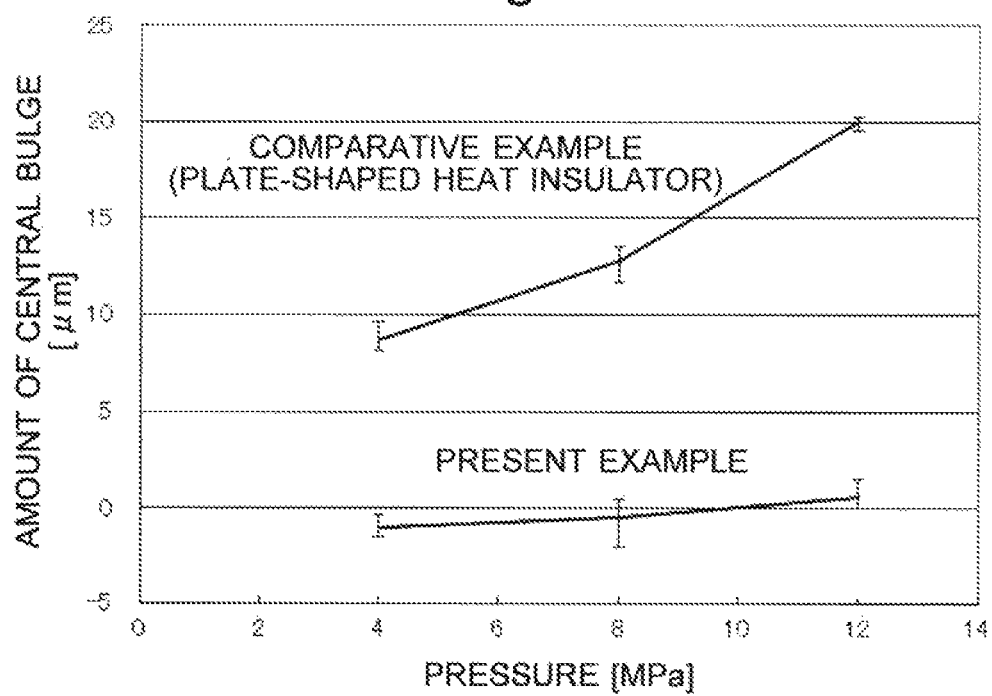
FIG. 5 is a graph showing the result of an experiment in which the difference in thickness between the center and an end portion in a planer direction of a resin-molded product was measured in three resin-molded products (present example) created under different pressures applied to the resin material during the molding process using the resin-molding device in the first embodiment as well as three resin-molded products (comparative example) created using a conventional resin-molding device.

(1-3) Result of Experiment Using Resin-Molding Device 10 in First Embodiment An experiment of creating resin-molded products (present example) has been performed using the resin-molding device 10 in the first embodiment. As a comparative example, a similar experiment has been performed using a device in which a glass epoxy laminate, which is a plate-shaped heat insulator, was entirely provided on each of the areas of the lower surface of the lower heater plate 151 and the upper surface of the upper heater plate 152 in place of the lower heat-insulating member 141 and the upper heat-insulating member 142 used in the present embodiment. In both present and comparative examples, the experiment was performed in three modes in which the amount of pressure applied to the resin material during the compression molding (this pressure is hereinafter called the "resin pressure in the molding process") was set at different levels (4 MPa, 8 MPa and 12 MPa). The results are shown in FIG. 5. In the comparative example, the amount of central bulge of the resin-molded products, which indicates the difference in thickness between the center and end portions in the planar direction of the resin-molded product, ranged from +8 to +20 μm. The amount of central bulge was dependent on the resin pressure in the molding process. By comparison, in the present example, the amount of central bulge was within a range of −1.5 to +1.0 μm. The absolute values were smaller than those of the comparative example. The amount of change depending on the resin pressure in the molding process was also smaller than in the case of the comparative example. Thus, it has been experimentally confirmed that the resin-molding device 10 in the present embodiment can produce a resin-molded product with a higher degree of uniformity in thickness than the resin-molding device which employs the conventional plate-shaped heat insulators.

(1-4) Variation of Resin-Molding Device 10 in First Embodiment

Figure 6:
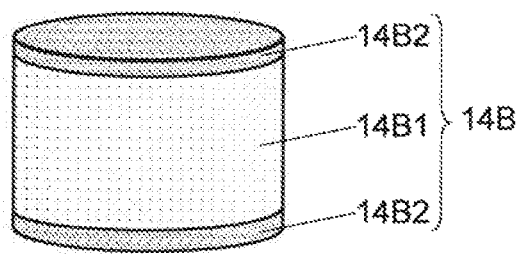
FIG. 6 is a perspective view of a pillar member in a variation of the resin-molding device according to the first embodiment.

The pillar member 14A used in the lower and upper heat-insulating members 141 and 142 in the resin-molding device 10 in the first embodiment is made of one kind of material, such as stainless steel. Alternatively, as shown in FIG. 6, a pillar member 14B consisting of a pillar-shaped main body 14B1 and heat-insulating films 14B2 provided on both the upper and lower sides of the pillar-shaped main body 14B1 may be used. A material having a lower thermal conductivity than the main body 14B1 is used as the material for the heat-insulating film 14B2. For example, stainless steel can be used as the material for the main body 14B1, while a heat insulator made of a silicone resin can be used as the heat-insulating film 14B2. A pillar member which simply consists of a heat insulator made of a silicone resin will lack strength against the pressure for the die-clamping operation. By adopting the configuration of the pillar member 14B in the present variation, the required strength can be ensured by the main body 14B1 while the heat insulation performance can be improved by the heat-insulating films 14B2. Although the main body 14B1 in the example of FIG. 6 has the heat-insulating film 14B2 on both the upper and lower sides, a main body 14B1 having the heat-insulating film 14B2 on only one of the upper and lower sides is also possible.

In the resin-molding device 10 according to the first embodiment, the pillar members 14A which are identical in material, shape and size are arranged in such a manner that their number density in the central area in the planar direction becomes higher than in the surrounding area, to adjust the amount of deformation of the pillar members 14A in each of the lower and upper heat-insulating members 141 and 142 so that their amount of deformation in the surrounding area becomes larger than in the central area. Alternatively, pillar members 14A which vary in the cross-sectional area parallel to the planar direction may be arranged in such a manner that the pillar members 14A located in the central area in the planar direction have a larger cross-sectional area than those located in the surrounding area, to achieve a similar adjustment of the amount of deformation of the pillar members 14A in each of the lower and upper heat-insulating members 141 and 142. In other words, pillar members 14A having a larger cross section are arranged in the central area of the die arrangement section 1611 which is opposite to the area including the loading points 171 and 172, while pillar members 14A having a smaller cross section are arranged in the area including the loading points 171 and 172. In this case, pillar members 14A made of the same material may be arranged at regular intervals.

A similar adjustment of the amount of deformation of the pillar members 14A in each of the lower and upper heat-insulating members 141 and 142 can also be achieved by arranging pillar members 14A made of different materials in such a manner that the pillar members 14A arranged in the central area in the planar direction have a higher level of rigidity than those arranged in the surrounding area. In other words, pillar members 14A having a higher level of rigidity are arranged in the central area of the die arrangement section 1611 which is opposite to the area including the loading points 171 and 172, while pillar members 14A having a lower level of rigidity are arranged in the area including the loading points 171 and 172. In this case, pillar members 14A having the same shape and size (cross-sectional area) may be arranged at regular intervals.

A change in the amount of deformation of the pillar members 14A in an outside-loaded platen can be achieved by changing the number density, cross-sectional area, or rigidity of the pillar members 14A. Two or all of these three parameters may also be used in combination.

In the resin-molding device 10 according to the first embodiment, the toggle link 133 for vertically driving the first platen 11 via the two loading points 171 is used as the force applier. A system with four loading points 171 acting on the four corners of the first platen 11 having a rectangular shape may also be used to vertically drive the first platen 11. The number of tie bars 132, which is two in the resin-molding device 10 in the first embodiment, may be changed to four (i.e. there may be four loading points 172 on the second platen 12).

A configuration having a single loading point on the first platen 11 at its center while using two or four tie bars 132 is also possible. In this case, since the first platen 11 is not an outside-loaded platen, the heat-insulating member for the first platen 11 does not need to be arranged in such a manner that the amount of deformation of each pillar member 14A increases from the center of the die arrangement section 1611 toward the loading point. Accordingly, the heat-insulating member for the first platen 11 may be a conventional plate-shaped heat insulator or an arrangement of pillar members 14A in which all pillar members 14A are deformed by the same amount independently of their respective positions. On the other hand, the second plate 12 is an outside-loaded platen similar to the one used in the previously described resin-molding device 10. Therefore, an upper heat-insulating member 142 which is similar to the one used in the resin-molding device 10 should be used for the second platen 12.

As in the case of providing a single loading point at the center of the platen, when the loading point on the first platen 11 is located within the die arrangement section 1611, the central area of the first platen 11 may possibly be deflected toward the second platen 12. In other words, the first platen 11 may become the center-loaded platen, depending on the method which is used to support the first platen 11 while allowing the same platen 11 to move vertically. In such a case, the heat-insulating member for the first platen 11 should be arranged in such a manner that the amount of deformation of each pillar member 14A increases from the outside (peripheral side) of the die arrangement section 1611 toward the loading point (central side). As in the previously described case of the outside-loaded platen, the change in the amount of deformation of the pillar members 14A can be achieved by changing the number density, cross-sectional area, or rigidity of the pillar members 14A. Two or all of these three parameters may also be used in combination.

The description of the first embodiment thus far has been concerned with the case where the resin-molding device 10 performs the compression molding. Transfer molding can also be performed by replacing the molding die 16 with a die for the transfer molding.

(2) Resin-Molding Device 20 in Second Embodiment

Figure 7:
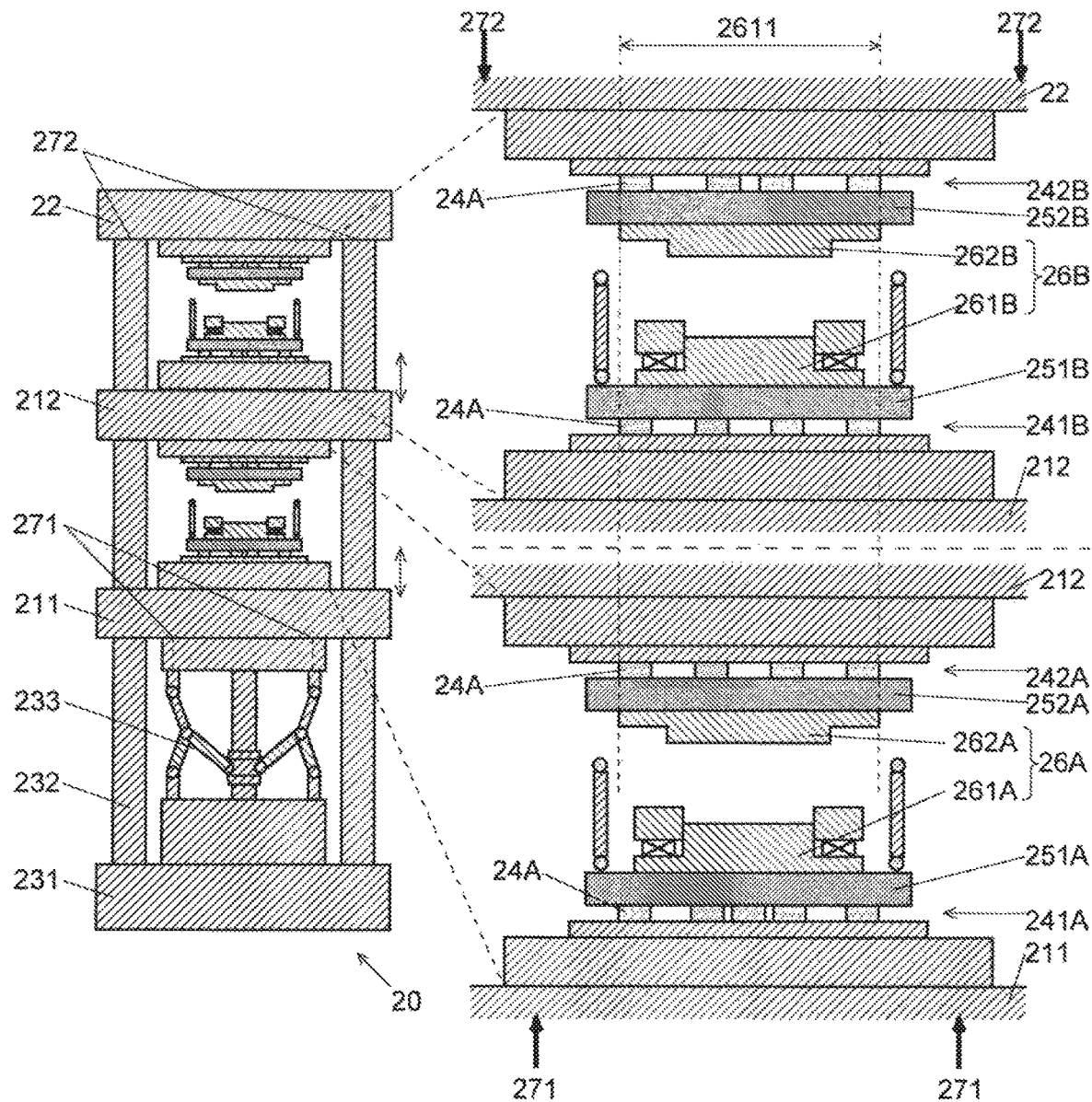
FIG. 7 is a side view (left) and its partially enlarged view (right) of the second embodiment of the resin-molding device according to the present invention.

As shown in FIG. 7, the resin-molding device 20 according to the second embodiment is similar to the resin-molding device 10 according to the first embodiment in that two vertical die bars 232 and the toggle link 233 are provided on the pedestal 231. A lower movable platen 211 and an upper movable platen 212 are mounted on the tie bar 232 in a vertically movable manner. A fixed platen 22 is fixed to the upper ends of the tie bars 232.

A first lower heat-insulating member 241A, first upper heat-insulating member 242A, first lower heater plate 251A, first upper heater plate 252A, and first molding die 26A (first lower die 261A and first upper die 262A) are provided between the lower movable platen 211 and the upper movable platen 212. Similarly, a second lower heat-insulating member 241B, second upper heat-insulating member 242B, second lower heater plate 251B, second upper heater plate 252B, and second molding die 26B (second lower die 261B and second upper die 262B) are provided between the upper movable platen 212 and the fixed platen 22. The die arrangement section of the first molding die 26A and that of the second molding die 26B are located at the same position on a plan view. These two die arrangement sections are denoted by the same numeral 2611 in FIG. 7. The toggle link 233 is connected to the loading points 271 which are located on the lower surface of the lower movable platen 211 and outside the die arrangement section 2611. The upper ends of the tie bars 232 are connected to the loading points 272 which are located on the lower surface of the fixed platen 22 and outside the die arrangement section 2611.

The first lower heat-insulating member 241A and the second upper heat-insulating member 242B have similar configurations to the lower heat-insulating member 141 and the upper heat-insulating member 142 in the first embodiment, respectively. On the other hand, the first upper heat-insulating member 242A and the second lower heat-insulating member 241B both include pillar members 24A arranged at regular intervals. The first lower heater plate 251A and the first upper heater plate 252A, as well as the second lower heater plate 251B and the second upper heater plate 252B, have similar configurations to the lower heater plate 151 and the upper heater plate 152 in the first embodiment, respectively. The first and second molding dies 26A and 26B have a similar configuration to the molding die 16 in the first embodiment.

In the resin-molding device 20 in the second embodiment, when the lower movable platen 211 is driven upward by the toggle link 233, the upper movable platen 212 is also driven upward via the first lower heat-insulating member 241A, first lower heater plate 251A, first molding die 26A, first upper hater plate 252A and first upper heat-insulating member 242A. The die-clamping operation is thereby performed between the lower movable platen 211 and the upper movable platen 212 as well as between the upper movable platen 212 and the fixed platen 22. The lower movable platen 211 receives the force applied from the toggle link 233 to the loading points 271 located outside the die arrangement section 2611, while the fixed platen 22 receives the tensile force applied from the tie bars 232 to the loading points 272 located outside the die arrangement section 2611. Accordingly, the lower movable platen 211 and the fixed platen 22 both correspond to the outside-loaded platens. Therefore, in the first lower heat-insulating member 241A and the second upper heat-insulating member 242B which are respectively located close to the lower movable platen 211 and the fixed platen 22, the pillar members 24A are arranged in such a manner that the amount of deformation of each pillar member 24A increases from the center of the die arrangement section 2611 toward the loading points 271 and 272, as in the first embodiment, whereby the deflection of the lower movable platen 211 and the fixed platen 22 is prevented from affecting the first and second molding dies 26A and 26B. Meanwhile, the upper movable platen 212 has no force applied outside the die arrangement section 2611. This platen is not an outside-loaded platen and no deflection occurs in it. Therefore, the pillar members 24A in the first upper heat-insulating member 242A and the second lower heat-insulating member 241B are arranged at regular intervals, i.e. in such a manner that all pillar members 24A undergo the same amount of deformation.

(3) Example of Modular Resin-Molding Device

Figure 8:
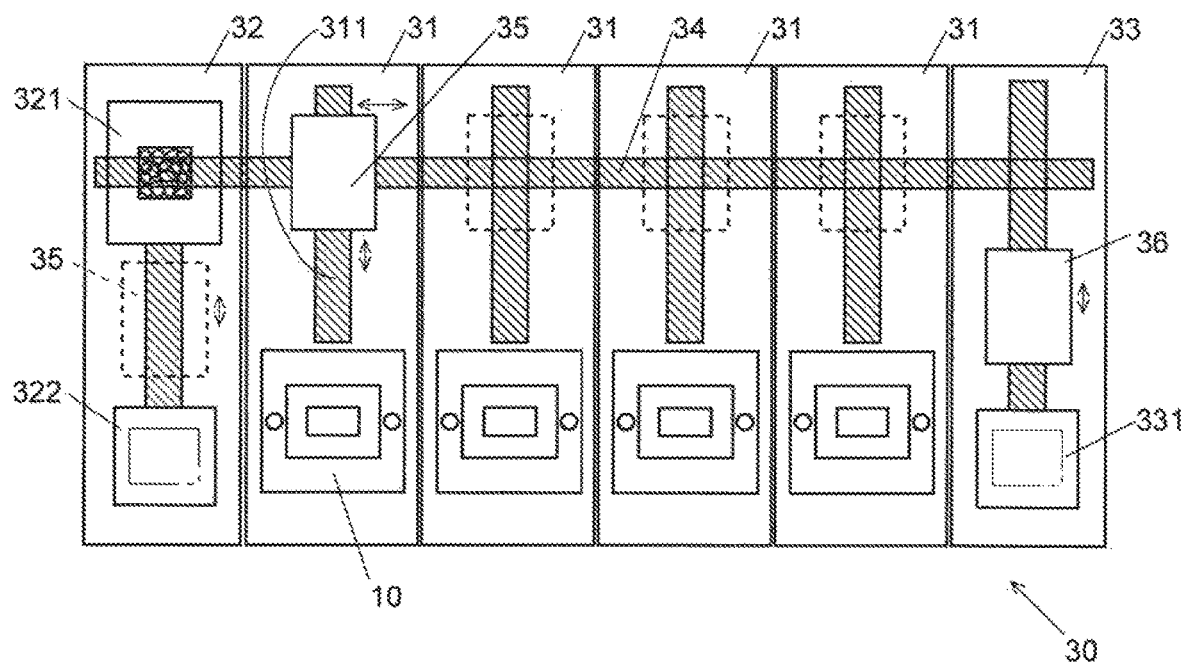
FIG. 8 is a plan view showing an example of the resin-molding device according to the present invention which includes a plurality of molding modules connected.

FIG. 8 shows a device 30 having one or more molding modules each of which includes the resin-molding device 10 according to the first embodiment. In other words, the resin-molding device 10 according to the first embodiment corresponds to one molding module. In the following description, the entire device 30 in FIG. 8 is also referred to as the "resin-molding device". The resin-molding device 30 is hereinafter described with reference to FIGS. 1A and 8.

The resin-molding device 30 includes a plurality of molding modules 31, one resin-material-and-substrate refilling module 32, one resin-molded-product unloading module 33, and a transfer mechanism 34 penetrating through those modules. The resin-molding device 30 further includes: a resin-material-and-substrate supply device 35 which can be transferred between the resin-material-and-substrate refilling module 32 and the plurality of molding modules 31 by the transfer mechanism 34; and a resin-molded-product unloading device 36 which can be transferred between the plurality of molding modules 31 and the resin-molded-product unloading module 33 by the transfer mechanism 34. These components will be hereinafter described.

Each molding module 31 corresponds to one resin-molding device 10 in the first embodiment and additionally includes an auxiliary transfer mechanism 311 for transferring the resin-material-and-substrate supply device 35 and the resin-molded-product unloading device 36 between the transfer mechanism 34 and the resin-molding device 10.

The resin-material-and-substrate supply device 35, with a substrate S contained in its upper section and a resin material R in its lower section, is transferred to a position near the resin-molding device 10 by the transfer mechanism 34 and the auxiliary transfer mechanism 311. Then, the device supplies the resin material R into the cavity 1612 of the resin-molding device 10, and the substrate S into the upper die 162. For example, a device having a construction similar to the resin supply device described in Patent Literature 4 can be used as the device for supplying the resin material R into the cavity 1612. As for the device for supplying the substrate S into the upper die 162, a commonly known manipulator can be used. The resin-material-and-substrate refilling module 32 includes: a resin-material refilling device 321 having a hopper for refilling the resin-material-and-substrate supply device 35 with the resin material R; and a substrate storage unit (magazine) 322 for storing the substrates S to be used for refilling the resin-material-and-substrate supply device 35.

The resin-molded-product unloading device 36 is transferred to a position near the resin-molding device 10 by the transfer mechanism 34 and the auxiliary transfer mechanism 311. Subsequently, by using the manipulator, the device removes the resin-sealed product (resin-molded product) with the sealing resin P created on the surface of the substrate S, from the upper die 162 of the resin-molding device 10. The removed product is transferred to the resin-molded-product unloading module 33 by the auxiliary transfer mechanism 311 and the transfer mechanism 34. The resin-molded-product unloading module 33 includes a resin-molded-product storage unit (magazine) 331 for storing the resin-molded products which have been unloaded.

The molding modules 31 can be attached to and detached from each other in the lateral direction in FIG. 8 (i.e. a parallel direction to the floor surface), thereby allowing for an after-adjustment (increase or decrease) of the number of modules as needed. Although a plurality of molding modules 31 are provided in the present example, the system may also be constructed with a single molding module.

With the resin-molding device 30 according to the present embodiment, after the process of supplying the resin material R into the cavity 1612 and attaching the substrate S to the upper die 162 has been completed in one molding module 31, the supply of the resin material R and the attachment of the substrate S in another molding module 31 can be performed while the die-clamping process is being performed in the former molding module 31. This allows multiple tasks to be simultaneously performed in parallel in the plurality of molding modules 31 and thereby improves the production efficiency of the resin-molded products. The number of molding modules 31 can be freely increased or decreased as needed in the process of manufacturing the resin-molding device 30 or after the completion of the resin-molding device 30.

The resin-material-and-substrate refilling module 32 and the resin-molded-product unloading module 33 in the previously described resin-molding device 30 are provided as separate modules. However, the two modules may be integrated into a single module. That is to say, the resin-material refilling device 321, substrate storage unit 322 and resin-molded-product storage unit 331 may be included in a single module. Additionally, the resin-material-and-substrate refilling module 32 may also be provided with one resin-molding device 10 of the first embodiment. It is also possible to integrate the resin-material-and-substrate supply device 35 and the resin-molded-product unloading device 36 into a single device by using the same manipulator for both the supply of the substrate and the unloading of the resin-molded product.

REFERENCE SIGNS LIST 10, 20, 30 . . . Resin-Molding Device
11 . . . First Platen (Force-Applied Platen, Outside-Loaded Platen)
111, 121 . . . Spacer Plate 12 . . . Second Platen (Force-Applied Platen, Outside-Loaded Platen)
131, 231 . . . Pedestal
132, 232 . . . Tie Bar
133, 233 . . . Toggle Link (Force Applier)
141 . . . Lower Heat-Insulating Member
142 . . . Upper Heat-Insulating Member
14A, 14B, 24A . . . Pillar Member
14B1 . . . Main Body of Pillar Member
14B2 . . . Heat-Insulating Film of Pillar Member
151 . . . Lower Heater Plate (Heating Mechanism)
152 . . . Upper Heater Plate (Heating Mechanism)
16 . . . Molding Die
161 . . . Lower Die
1611, 2611 . . . Die Arrangement Section
1612 . . . Cavity
162 . . . Upper Die
171, 172, 271, 272 . . . Loading Point
211 . . . Lower Movable Platen (Force-Applied Platen, Outside-Loaded Platen)
212 . . . Upper Movable Platen
22 . . . Fixed Platen (Force-Applied Platen, Outside-Loaded Platen)
241A . . . First Lower Heat-Insulating Member
241B . . . Second Lower Heat-Insulating Member
242A . . . First Upper Heat-Insulating Member
242B . . . Second Upper Heat-Insulating Member
251A . . . First Lower Heater Plate (Heating Mechanism)
251B . . . Second Lower Heater Plate (Heating Mechanism)
252A . . . First Upper Heater Plate (Heating Mechanism)
252B . . . Second Upper Heater Plate (Heating Mechanism)
26A . . . First Molding Die
26B . . . Second Molding Die
261A . . . First Lower Die
261B . . . Second Lower Die
262A . . . First Upper Die
262B . . . Second Upper Die
30 . . . Resin-Molding Device
31 . . . Molding Module
311 . . . Auxiliary Transfer Mechanism
32 . . . Resin-Material-and-Substrate Refilling Module
321 . . . Resin-Material Refilling Device
322 . . . Substrate Storage Unit
33 . . . Resin-Molded-Product Unloading Module
331 . . . Resin-Molded-Product Storage Unit
34 . . . Transfer Mechanism
35 . . . Resin-Material-and-Substrate Supply Device
36 . . . Resin-Molded-Product Unloading Device
F . . . Release Film
P . . . Sealing Resin
R . . . Resin Material
S . . . Substrate

The invention claimed is:

1. A resin-molding device, comprising:
   a) a first platen and a second platen which are two plate-shaped members arranged parallel to each other in such a manner as to allow a molding die including a pair of mutually facing dies to be arranged in a die arrangement section which is provided between the two platens and is a central region located on a plate surface;
   b) a link that applies a force from a predetermined loading point to a force-applied platen which is one of the first and second platens;
   c) a heater provided between the force-applied platen and the molding die; and
   d) a heat-insulating member formed by a plurality of elastic pillar members arranged between the force-applied platen and the heater, the pillar members configured in such a manner that an amount of deformation of each pillar member increases with a position of the pillar member being closer to the loading point, wherein a number density of the plurality of pillar members varies depending on the position, wherein the number density decreases from a center of the die arrangement section toward the loading point, such that, among the plurality of pillar members, pillar members closer to the loading point than to a center of the die arrangement section are arranged at a lower number density than pillar members closer to the central area of the die arrangement section.

2. The resin-molding device according to claim 1, wherein a cross-sectional area of the plurality of pillar members varies depending on the position.

3. The resin-molding device according to claim 1, wherein a rigidity of the plurality of pillar members varies depending on the position.

4. The resin-molding device according to claim 1, wherein the heat-insulating member is made of a metallic material having a thermal conductivity of 25 W/(m·° C.) or lower.

5. The resin-molding device according to claim 1, wherein the heat-insulating member is made of a ceramic material.

6. The resin-molding device according to claim 1, wherein the heat-insulating member comprises a pillar-shaped main body and a heat-insulating film made of a material having a lower thermal conductivity than the main body and provided on one or both of upper and lower sides of the main body.

7. The resin-molding device according to claim 1, further comprising three or more platens allowing a molding die to be arranged between the neighboring platens, wherein the three or more platens include at least two platens neighboring each other and configured as the first platen and the second platen.

8. The resin-molding device according to claim 1, further comprising:
   a molding module including the first platen, the second platen, the link, the heater and the heat-insulating member, the molding module configured to allow a plurality of the molding modules to be connected to each other in one direction;
   a resin-material supplier for supplying a resin material to each molding die in one or a plurality of the molding modules;
   a resin-material refilling module including a resin-material refiller for refilling the resin-material supplier with the resin material; and
   a transfer system for transferring the resin-material supplier, the transfer system extending in the aforementioned direction through the one or plurality of the molding modules and the resin-material refilling module when the one or plurality of the molding modules and the resin-material refilling module are connected in series.

* * * * *